United States Patent
Sumitani

(10) Patent No.: US 7,964,892 B2
(45) Date of Patent: Jun. 21, 2011

(54) LIGHT EMITTING DEVICE

(75) Inventor: Naofumi Sumitani, Itano-gun (JP)

(73) Assignee: Nichia Corporation, Anan-shi (JP)

( * ) Notice: Subject to any disclaimer, the term of this patent is extended or adjusted under 35 U.S.C. 154(b) by 154 days.

(21) Appl. No.: 11/946,597

(22) Filed: Nov. 28, 2007

(65) Prior Publication Data

US 2008/0128718 A1 Jun. 5, 2008

(30) Foreign Application Priority Data

Dec. 1, 2006 (JP) .................. 2006-325095
Nov. 27, 2007 (JP) .................. 2007-305489

(51) Int. Cl.
*H01L 31/111* (2006.01)

(52) U.S. Cl. ............. 257/118; 257/21; 257/82; 257/89; 257/257; 257/594

(58) Field of Classification Search ............. 257/21, 257/80, 82, 88, 89, 91, 118, 257, 290, 367, 257/594, 599, 601, E31.054, E31.084, E31.099, 257/E31.105, E27.051, E29.327, E25.032
See application file for complete search history.

(56) References Cited

U.S. PATENT DOCUMENTS

| 2002/0028527 | A1* | 3/2002 | Maeda et al. | 438/29 |
| 2004/0065894 | A1* | 4/2004 | Hashimoto et al. | 257/100 |
| 2004/0169466 | A1* | 9/2004 | Suehiro et al. | 313/512 |
| 2006/0081865 | A1* | 4/2006 | Sakamoto et al. | 257/98 |
| 2006/0175716 | A1* | 8/2006 | Nakashima | 257/787 |
| 2006/0231852 | A1* | 10/2006 | Kususe et al. | 257/99 |
| 2006/0261364 | A1* | 11/2006 | Suehiro et al. | 257/100 |
| 2007/0131954 | A1* | 6/2007 | Murayama et al. | 257/98 |

FOREIGN PATENT DOCUMENTS

JP 2003-017753 A 1/2003

* cited by examiner

*Primary Examiner* — N Drew RIchards
*Assistant Examiner* — Joannie A Garcia
(74) *Attorney, Agent, or Firm* — Global IP Counselors, LLP

(57) ABSTRACT

A light emitting device, comprises: a first semiconductor light emitting element; a second semiconductor light emitting element; a first metal member mounting on its top face the first semiconductor light emitting element; a second metal member mounting on its top face the second semiconductor light emitting element; and a resin package having on its top face a window through which light is taken off from the first semiconductor light emitting element and the second semiconductor light emitting element, wherein the second metal member is thinner around its peripheral edge than in its middle, and the rear face of the first metal member is facing the top face of the peripheral edge.

9 Claims, 3 Drawing Sheets

LIGHT EMITTING DEVICE

BACKGROUND OF THE INVENTION

1. Field of the Invention

The present invention relates to a light emitting device, and more particularly relates to a light emitting device using a light emitting element such as a light emitting diode.

2. Background Information

Information terminal devices featuring semiconductor light emitting elements occupy an important position today as optical printers and so forth. In particular, full-color printing has become possible with the development of conductor light emitting elements capable of emitting RGB (red, green, and blue) at high brightness levels for all colors. For example, there is a known light emitting device in which a red LED, a green LED, and a blue LED are each mounted on a lead frame, and these lead frames are insulated a specific distance apart. With a light emitting device such as this, however, the lead frames have to be kept apart so they do not touch each other, so the elements have to be disposed away from each other, and this is a problem in that color mixing of the light suffers.

To deal with this problem, a light emitting device has been proposed in which independent lead frames are insulated from one another so that voltage is applied individually to a red LED, a green LED, and a blue LED, and an electrode formed on the bottom of the red LED and a insulating substrate formed on the bottoms of both the green LED and the blue LED are mounted on one of these lead frames so as to be in contact (see Japanese Laid-Open Patent Application 2003-17753, for example). With this light emitting device, this configuration improves the color mixing of the light of these colors while also affording a compact size.

However, when a light source featuring light emitting elements such as these is driven under harsher conditions, such as when the drive speed is raised, the brightness of the light emitting elements is increased, or the device is used for extended periods, the heat generated by the driving of the light emitting elements themselves shifts the wavelength of the light emitted from the light emitting elements. In particular, when light emitting elements that generate a large enough quantity of heat to become a heat source and light emitting elements whose wavelength fluctuates over a wide range are mounted in contact on the same substrate and/or on the same layer, color becomes unbalanced as the temperature rises. This loss of color balance leads to a critically adverse effect due to minute fluctuations in characteristics, as in optical printer devices and scanners that sense by using electrical and optical characteristics.

SUMMARY OF THE INVENTION

The present invention is an object thereof to provide a high-quality light emitting device which can be improving color mixing and kept to a minimum nonuniform of color balance.

The present invention provides a light emitting device, comprising: a first semiconductor light emitting element; a second semiconductor light emitting element; a first metal member mounting on its top face the first semiconductor light emitting element; a second metal member mounting on its top face the second semiconductor light emitting element; and a resin package having on its top face a window through which light is taken off from the first semiconductor light emitting element and the second semiconductor light emitting element, wherein the second metal member is thinner around its peripheral edge than in its middle, and the rear face of the first metal member is facing the top face of the peripheral edge.

With the present invention, a high-quality light emitting device is obtained with which two light emitting element can be mounted on different members, and the distance between them is kept to a minimum, so that even under harsh environments such as use for extended periods, the requirement for higher drive speed and brighter light emitting elements can be satisfied while also preventing a disturbance of color balance and improving color mixing.

The light emitting device of the present invention can be utilized in illumination light sources, various indicators, vehicle lamps, display light sources, backlight light sources for LCD and various other types of illuminating apparatus.

DETAILED DESCRIPTION OF THE PREFERRED EMBODIMENTS

Figure 1A:
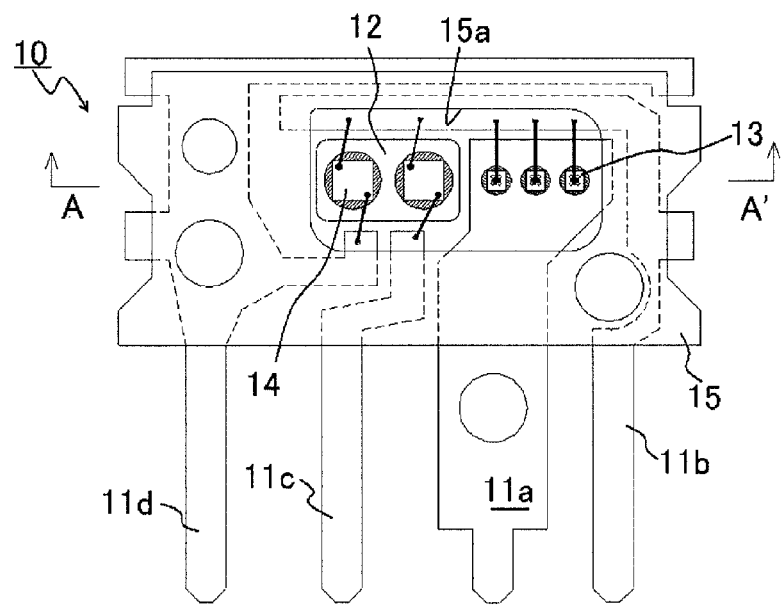
FIGS. 1*a* to 1*c* are simplified views, with 1*a* being a front view, 1*b* a cross-sectional view, 1*c* a rear view of the main components in the light emitting device of the present invention, respectively.

The light emitting device of the present invention is constituted by first and second semiconductor light emitting elements (hereinafter also referred to merely as "light emitting elements"), first and second metal members on which these light emitting elements are mounted, and a resin package.

Semiconductor Light Emitting Elements

The light emitting element is generally made of semiconductor, and preferably it is element called light emitting diodes. For example, it includes a laminated structure that contains an active layer on a substrate, which is made of a nitride semiconductor such as InN, AlN, GaN, InGaN, AlGaN, InGaAlN or the like, and a compound semiconductor of a group III-V element, a II-VI element, and the like, and may have a pair of electrodes. The electrodes may comprise positive and negative electrodes formed over opposite sides of the substrate, or positive and negative electrodes may be formed over the same side of the substrate. The positive and negative electrodes in this case need not necessarily consist of just one each, and two or more of each may be formed.

With the light emitting device of the present invention, at least first and second semiconductor light emitting elements are mounted. These two light emitting elements may consist of two elements of the same type, but preferably generate different amounts of heat. There are no particular restrictions on the difference in the amounts of heat generated, but this can usually be the difference in heat generation attributable to the type of semiconductor material, as discussed above. Also, two kinds of semiconductor light emitting elements with different amounts of heat generation can instead be said to have different wavelengths of the light emitted from the active layer. There are no particular restrictions on the degree of difference in the amounts of heat generation between the two, but an example may be the difference between a red light emitting element and a green or blue light emitting element.

Also, rather than using just two light emitting elements, three or more may be mounted, in which case there may be two kinds of light emitting elements with different heat generation amounts or wavelengths, or there may be three or more kinds of light emitting elements with different heat generation amounts or wavelengths.

The light emitting elements are mounted on metal members (discussed below), and a bonding material is used for this purpose. For instance, in the case of light emitting elements formed by growing a nitride semiconductor on a sapphire substrate, that emit blue and/or green light, an epoxy resin, silicone, or the other resin materials can be used. When degradation of the resin materials due to light or heat from the light emitting elements is taken into account, the back side of the light emitting elements may be plated with aluminum. Also, a solder (e.g., eutectic Au—Sn), a brazing material (e.g., a low-melting point metal), or the like may be used not using a resin as a bonding material. In the case of a light emitting element with electrodes formed on both sides, such as a light emitting element that is formed by GaAs, or the like and emits red light, die bonding may be performed using a conductive paste made of silver, gold, palladium, or the like.

The electrical connection of the light emitting elements to the metal members can be accomplished by wire bonding to the metal members using wires. The wire preferably has good ohmic characteristics with the electrodes of the semiconductor elements, or has good mechanical connection characteristics, or has good electrical conductivity and thermal conductivity. The thermal conductivity is preferably about 0.01 cal/S·cm$^{2.\circ}$ C./cm or higher, and about 0.5 cal/S·cm$^{2.\circ}$ C./cm or higher is even better. When ease of work and so forth are taken into account, the diameter of the wire is preferably about 10 to 45 μm. Examples of this wire include gold, copper, platinum, aluminum, and other such metals and alloys thereof. Among these, it is preferably gold from the view of reliability of the wire bonding, stress relaxation after the wire bonding, and the like.

Metal Members

The metal member usually serves as a base on which are mounted electrodes and/or semiconductor elements for electrically connecting with the semiconductor light emitting elements. In particular, the first metal member serves as an electrode and a base, and the second metal member serves primarily as a base. Furthermore, in the present invention, one or more other metal members may be provided in addition to the first and second metal members. As mentioned above, one or more light emitting elements that are the same as or different from the two kinds of different semiconductor light emitting elements may be mounted on the metal members.

The metal member may be substantially in the form of a plate, or may be in the form of a plate that is textured or undulating. The thickness thereof may be uniform, or the member may be thick in some parts and thin in others. There are no particular restrictions on the material, but forming the metal members from a material with a relatively high thermal conductivity, for example, a material that has a thermal conductivity of about 200 W/m·K or higher, or one with a relatively high mechanical strength, or one that lends itself well to punching, etching, or other such working. Forming from such a material allows the heat generated by the semiconductor elements to release more efficiently. More specifically, examples include copper, aluminum, gold, silver, tungsten, iron, nickel, and other such metals, and alloys such as iron-nickel or phosphor bronze. Also, the surface of the metal members is preferably given a reflective plating so that the light from the mounted light emitting elements can be taken off more efficiently.

It is particularly preferable for the second metal member to be thinner around its peripheral edge than in its middle. This thinner peripheral edge will be called the "thin film (plate) peripheral edge", hereinafter, the word of "film" also means "sheet", or "board" as well as "plate." This thin film peripheral edge may be all or part of the second metal member, and it may be just one location or a plurality of locations. When this thin film peripheral edge is viewed in cross section, it can be said that convex parts are formed on the side faces of the second metal member. The thin film peripheral edge of the second metal member need not have the same thickness all over, and as long as it is thinner than the middle part, it may have a plurality of thicknesses, or may have an uneven thickness. The places where the thickness differs may be such that the thickness varies in steps, or it may be vary as a slope. An even thinner portion may also be provided at a specific location. The thin film peripheral edge may be thinner on the front and/or back side of the second metal member, and the front side or the back side may become thinner partially, but preferably both the front and back sides become partially or entirely thinner. It is suitable, for example, if the thickest portion (middle part) of the second metal member is about 0.3 to 2 mm, and the thinnest portion (thin film peripheral edge) is about 0.05 to 0.2 mm. Adjusting the thickness to within these ranges allows the length in the thickness direction to be kept to a minimum when overlapped with the first metal member, and also allows the second metal member to exhibit an adequate heat dissipation effect. There are no particular restrictions on the width of the thin film peripheral edge, but it is suitable, for example, for the total length to be no more than about 4.95 mm. A thin film peripheral edge such as this ensures enough surface area, so that an adequate heat dissipation effect can be maintained while allowing another metal member, such as the first metal member, to be overlapped with this thin film peripheral edge so that the light emitting elements mounted on the first and second metal members can be disposed a specific distance apart or a minimum distance apart, and color variance can be reduced. Furthermore, when the thin film peripheral edge is overlapped with another metal member, the thickness can be kept to a minimum, affording a more compact size.

Figure 2A:
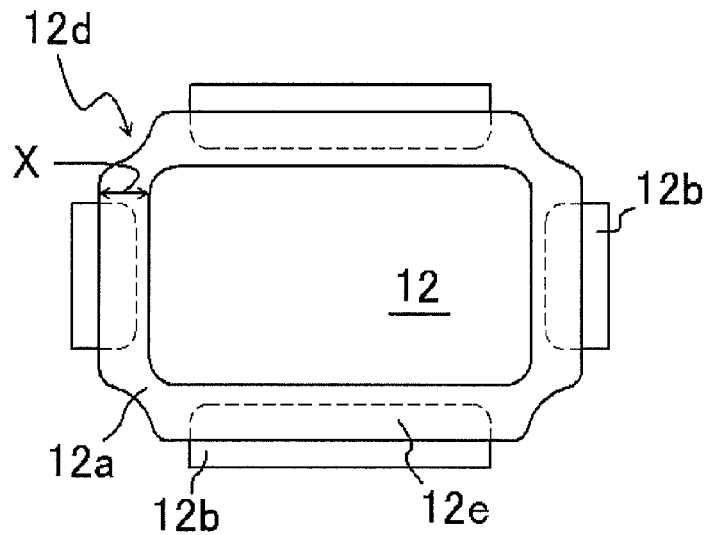
FIGS. 2*a* to 2*c* are simplified views for explanation of metal members, with 2*a* being a front view, 2*b* a top view, 2*c* a side view of the main components in the light emitting device of the present invention, respectively.
Figure 2B:
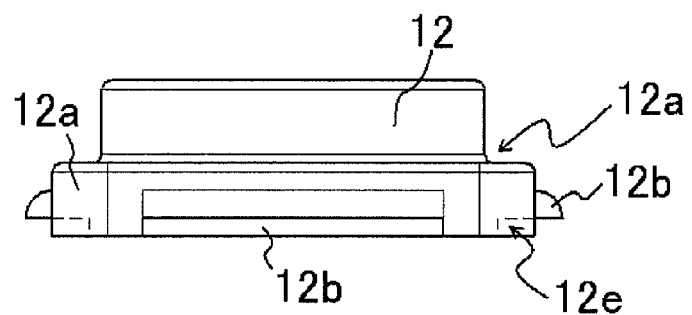
Figure 2C:
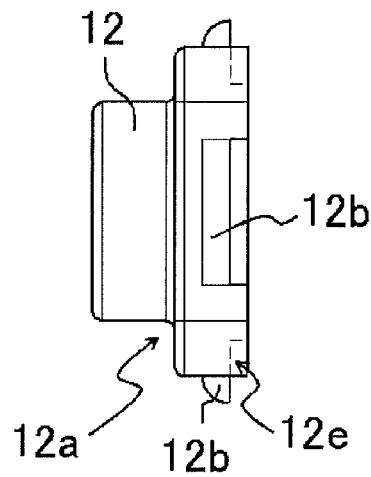

As shown in FIGS. 2a to 2c, when the thin film peripheral edge 12a is present all the way around the second metal member 12, regardless of the shape of the second metal member 12 itself, the thin film peripheral edge 12a of the second metal member 12 preferably has a cut-away shape (cut-outs 12d) at the corners (i.e., a cut-off the edges shape). In other words, it is preferable if the corners of the thin film peripheral edge 12a in plan view are formed so that their width is equal to or less than the surrounding area, or if recesses are formed in the corners. These cut-outs 12d are preferably only partially cut away, rather than the entire corners (such as in the width direction) of the thin film peripheral edge 12a in plan view being cut away. The shape of these cut-outs 12d can be a shape that is cut away in steps, a shape that is cut away in a straight line, or a shape obtained by removing the corners from a square, a diamond, or a polygon, but is preferably a sloped shape obtained by rounding with a circle, an ellipse, or a parabola (see 12d in FIG. 2a). This cutting away of the corners can be done to prevent the second metal member from shifting within a resin package (discussed below) when the second metal member is inserted in the resin package, and allows the second metal member to be disposed at the proper site.

Also, the second metal member preferably has an extremely thin portion that is even thinner than the thin film peripheral edge formed at a part of the thin film peripheral edge other than the corners. This extremely thin portion may be formed everywhere other than at the corners, and it may be formed at just one location or at two or more locations. In plan view, extremely thin portions are preferably formed symmetrically on opposite sides of the second metal member. Also, the extremely thin portion may not be formed in the entire width direction of the thin film peripheral edge of the second metal member (the direction of arrow X in FIG. 2a) in plan view. The result is that the integrity of the light emitting device as a whole can be increased without interfering with the heat dissipation efficiency of the second semiconductor light emitting element mounted on the top face of the second metal member. This extremely thin portion preferably has a thickness of about 0.3 mm or less, about 0.28 mm or less, and a width (the direction of arrow X in FIG. 2a) of about 1.0 mm or less, about 0.8 mm or less for example. This extremely thin portion may be thinner on the front and/or back side of the thin film peripheral edge, but preferably is partially thinner on the back side.

Protrusions may further be formed to the side of the extremely thin portion. These protrusions are formed on the side faces at the extremely thin portion of the second metal member, and are usually even thinner than the extremely thin portion. These protrusions are usually formed as burr when the extremely thin portion is formed. For example, they are formed as burr by pressing from above or below. The result is that these protrusions make its way into the resin package, and this affords good adhesion between the second metal member and the resin package.

The second metal member is disposed so that its rear face is exposed from the resin package (discussed below). The "rear face" here refers to the back side opposite the side on which the light emitting elements are mounted. This improves the heat dissipation effect of the second metal member. The rear face of the second metal member exposed from the rear face of the resin package has a shape that is the result of subtracting the plan view shape of the extremely thin portion from the plan view shape that is the combination of the thin film peripheral edge and the portion that is the thickest part of the second metal member, and has at its corners (in plan view) protruding parts (see 12c in FIG. 1c) whose shape corresponds to the above-mentioned cut-outs. There are no particular restrictions on the shape of these protruding parts, and any of various shapes can be used, but examples include a partially cut-away triangular shape, tetragonal shape, polygonal shape, circle, fan shape, gingko leaf shape, or the like, or a shape similar to these, or a shape in which part of these has been modified. Having these protruding parts improves soldering of the resin package back face to this location, connection of heat-sink members, and so forth.

There are no particular restrictions on the shape of the second metal member, so long as the shape satisfies the above requirements, but the basic shape when not taking into account the thin film peripheral edge, the extremely thin portion, the protruding parts at the corners, the cut-outs, and so forth is preferably a tetragonal shape, a polygonal shape or a shape similar to this. Employing a shape such as this affords more efficient heat dissipation at a given surface area.

The second metal member is fixed by the resin package (discussed below) so that part of it overlaps the first metal member. That is, the upper face of the thin film peripheral edge disposed in the vicinity of the first metal member with the resin package therebetween faces the rear face of the first metal member. This allows the second light emitting element mounted on the second metal member to be disposed as near as possible to the first light emitting element mounted on the first metal member, without increasing the length in the thickness direction. For instance, the distance from the end of the first metal member to the end of the second metal member on the surface of which is mounted the second light emitting element may be about 0.5 to 2 mm.

In addition to having a region in which the light emitting element is mounted and which is connected to the light emitting element, the metal member may have a region extending as a lead terminal connecting with an external component. The lead terminal can be suitably bent or deformed according to mounting type of the light emitting device (i.e., surface mounted device (SMD) such as a side view type, a top view type or the like, insertion type which is used by inserting a lead terminal into a substrate and the like, etc.) of the present invention and how it will be used.

Also, the metal members, such as the first metal member and/or another metal member, may have an expanded/wider part formed to improve heat dissipation efficiency somewhere other than where electrical connections are made or where the light emitting elements are mounted. In this case, the expanded/wider part preferably extends outside of the resin package. Also, this expanded/wider part may be bent, deformed, etc., along the outer surface of the resin package.

Resin Package

With the semiconductor device of the present invention, at least the first and the second metal members are fixed by a resin package. A plurality of the metal members may be molded, fixed, sealed or covered by this resin package, integrally or in a block form. This resin package usually includes a resin for securing the metal members by molding or fixing resin, and a resin for covering the light emitting element and the wire by sealing or covering resin. In all cases, the resin may be formed from any material, as long as it ensures insulation to the semiconductor elements and so on. Specific examples of which, especially for molding or fixing, include polyphthalamide (PPA), polycarbonate resin, polyphenylene sulfide (PPS), liquid crystal polymer (LCP), ABS resin, epoxy resin, phenol resin, acrylic resin, PBT resin, and other such resins, and the like. Among these, it is preferable to select materials having light resistant characteristics such as opalescent resins and the like. Also, it may be to use a translucent resin for sealing or covering, which is excellent for weather resistance, such as silicone resin, urea resin, and the like. In the present invention, the term "translucent" means that the material transmits at least about 70%, and preferably at least about 80%, and more preferably at least about 90%, and even more preferably at least about 95%, of the light emitted from the light emitting element. In combination of the molding or fixing resins and the sealing or covering resins, it is preferable to select materials with little different in their coefficients of thermal expansion, taking into account factors such as adhesion between the sealing or covering resins and the fixing or molding resins that has been subjected to the effects of heat produced from the light emitting elements and so forth.

Various kinds of dye, pigment, or the like may also be mixed into these materials as colorants. Examples of colorants include $Cr_2O_3$, $MnO_2$, $Fe_2O_3$, carbon black, and the like.

These materials may contain a diffuser or a fluorescent substance. A diffuser is an agent that diffuses light, and serves to lessen directionality from the light emitting element and to widen the viewing angle. A fluorescent substance is one that converts light from the light emitting element, and is able to convert the wavelength of light emitted from the light emitting element to the outside of the package. If the light from the light emitting element is visible light with a short wavelength and high energy, then it is preferable to use an inorganic phosphorescent material such as ZnCdS:Cu, YAG:Ce, or nitrogen-containing CaO—$Al_2O_3$—$SiO_2$ that has been activated with europium and/or chromium, or a perylene derivative, which is an organic phosphorescent material.

There are no particular restrictions on the size and shape of the resin package (molding or fixing resin), but it may, for example, be in the form of a circular cylinder, an elliptical cylinder, a sphere, an egg, a triangular cylinder, a quadrangular cylinder, a polyhedral cylinder, a shape similar to these, or the like. It is preferable to form a window in a region that can take off the light emitted by the light emitting elements, or so as to expose the metal members of the region disposing the light emitting element. It may also be formed with an integral lens for focusing the light. There are no particular restrictions on the shape and size of the window as long as it is larger than the total surface area occupied by the light emitting elements mounted in the device of the present invention.

The bottom face and a wall in the window of the resin package (molding or fixing resin) may be continuously constituted (i.e., contact) with the substrate of the light emitting element and the metal members, and a part of the metal members may expose from the resin package material so as to form pathway for electrical connection or heat dissipation. The resin package (molding or fixing resin) may be include a reflecting material reflecting the light from the light emitting element in the window of the resin package, and the sealing or covering resin for the window may be formed in the shape of a reflector for focusing the light.

As discussed above, the resin package (molding or fixing resin) exposes at its rear face the second metal member, and a recess is formed so that the resin package will come into contact with part of the second metal member. Usually, the resin package (molding or fixing resin) is formed integrally with a metal member (preferably more than one) by melting and casting the above-mentioned material through a gate formed at a specific location and into a closed metal mold in which the metal member has been inserted, and curing the resin. In this case, the second metal member is disposed at a specific location in the mold so that part of the second metal member is exposed at the rear face when the resin package (molding or fixing resin) is taken out of the mold. The second metal member must be fixed so as not to be moved out of position by the inflow of the resin. To this end, holes are formed in part of the mold (at locations corresponding to the cut-outs at the corners of the thin film peripheral edge) for inserting and fixing positioning pin members. With the resin package (molding or fixing resin) of the light emitting device of the present invention, when these pin members are removed, recesses for the insertion of these pin members are formed at locations corresponding to the cut-outs at the corners of the thin film peripheral edge, for example. The effect of forming these recesses is that, for example, when the light emitting device of the present invention is mounted on a mounting substrate and the exposed part of the second metal member on the back side is fixed by solder or the like, enough space will be ensured to allow excess solder or the like to flow.

A protective element may be mounted in the light emitting device of the present invention other than the above light emitting elements. The protective element may be just one, or two or more. There are no particular restrictions on the protective element, and any known type that is mounted in light emitting devices may be used. Specific examples include circuit protection elements that protect against overheating, over-voltage, over-current, such as static electricity protection elements. For example, it may be Zener diode, transistor diode, and the like.

Further, the light emitting device of the present invention may be equipped with a lens or the like made of plastic or glass, at the portion where the light of the light emitting element is emitted (such as the package portion above the light emitting element), for example, as an internal part of the resin package (molding or fixing resin), or as an accessory on the resin package surface. To allow light to be taken off more efficiently from the light emitting element, the light emitting device may also be equipped with a reflecting member, light diffusion member and the like, or to allow light amount to be controlled, the light emitting device may also be equipped with anti-reflection member and the like, or any of various other components.

Examples of the light emitting device of the present invention will now be described in detail through reference to the drawings.

Example 1

As shown in FIGS. 1$a$ to 1$c$, the light emitting device 10 in this example is a side view type light emitting device, in which a first metal member 11$a$, a second metal member 12, and other metal members 11$b$ to 11$d$ that function as terminals are fixed to a resin package (molding or fixing resin) 15, and ends of these metal members 11$a$ to 11$d$ protrude from one side of the resin package 15.

The resin package 15 is formed, for example, from PBT, PPA, or another such resin package material that has been used in the past, and its basic shape is a substantially cuboid shape measuring 10×14.5×1.5 mm in size. A window 15$a$ for taking off the light emitted by the light emitting elements (discussed below) is formed on one side of the resin package 15.

Three light emitting elements 13 that generate relatively little heat are mounted on the first metal member 11$a$. These light emitting elements 13 are formed from an AlInGaP/GaAs semiconductor that emits red light whose main wavelength is approximately 630 nm. The light emitting elements 13 are die-bonded onto the first metal member 11$a$ with a silver paste, for example. The spacing between these light emitting elements 13 is set to about 0.6 mm. This first metal member is set to be wider than the other metal members.

Two light emitting elements 14 that generate a relatively large amount of heat and that are substantially rectangular in plan view are formed on the second metal member 12 (size: 2.1 mm×1.2 mm). These light emitting elements 14 are formed, for example, from an InGaN semiconductor that emits green light whose main wavelength is approximately 525 nm or an InGaN semiconductor that emits blue light whose main wavelength is approximately 470 nm, and is formed by successively laminating on a sapphire substrate an n-type contact layer composed of n-type GaN, an n-type clad layer composed of n-type AlGaN, an active layer composed of nitride semiconductor such as InN, AlN, GaN, InGaN, AlGaN, InGaAlN or the like, a p-type clad layer composed of p-type AlGaN or InGaN, and a p-type contact layer composed of p-type GaN. These light emitting elements 14 are die-bonded with a epoxy resin, for example. The spacing between these light emitting elements 14 is set to about 1.05 mm.

As other metal members, a metal member 11$b$ that is electrically connected to one of the electrodes of the light emitting elements 13 and 14, and metal members 11$c$ and 11$d$ that are electrically connected to the other electrode of the light emitting elements 14 are both fixed by the resin package 15. The metal members and the electrodes are connected by wires made of gold with a diameter of about 10 μm, for example.

The first metal member 11a and the other metal members 11b to 11d are formed, for example, by using a press to punch out a silver-plated copper plate with a thickness of 0.15 mm, and the second metal member 12 is formed the same way but using a plate with a thickness of 0.85 mm. Plating may also be performed if desired after pressing. The thin film peripheral edge 12a (discussed below) of the second metal member 12 can be formed by pressing, and the extremely thin portion 12e and the protrusions 12b with a press from the back side of the second metal member 12.

In particular, as shown in FIGS. 2a to 2c, the second metal member 12 has all the way around its peripheral edge a thin film peripheral edge 12a that is thinner than the middle part. This thin film peripheral edge 12a is formed so that the thickness (height) is less on the upper face side, and its thickness (height) is about 0.4 mm and its width (arrow X in FIG. 2a) is about 0.2 mm.

Also, the second metal member 12 has cut-outs 12d with a plan view shape such that the corners of the thin film peripheral edge 12a are rounded.

Extremely thin portions 12e that is even thinner than the peripheral edge 12a are formed in parts of the peripheral edge 12a other than the corners. The thickness (height) of these extremely thin portions 12e is about 0.2 mm, for example, and they are formed so that the thickness (height) is less on the lower face side. The width of these extremely thin portions 12e (the length in the arrow X direction in FIG. 2a) is about 0.2 mm. Also, the extremely thin portions 12e have protrusions 12b that protrude to the side. These protrusions 12b are formed substantially to all sides from the places where the extremely thin portions 12e are formed. The protrusion length of the protrusions 12b to the sides (the length in the arrow X direction in FIG. 2a) is about 0.15 mm, and the thickness (height) is about 0.15 mm.

Figure 1B:
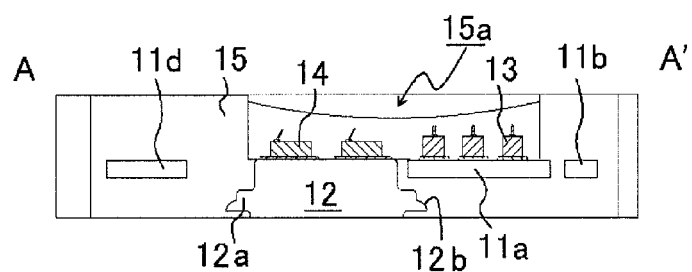
Figure 1C:
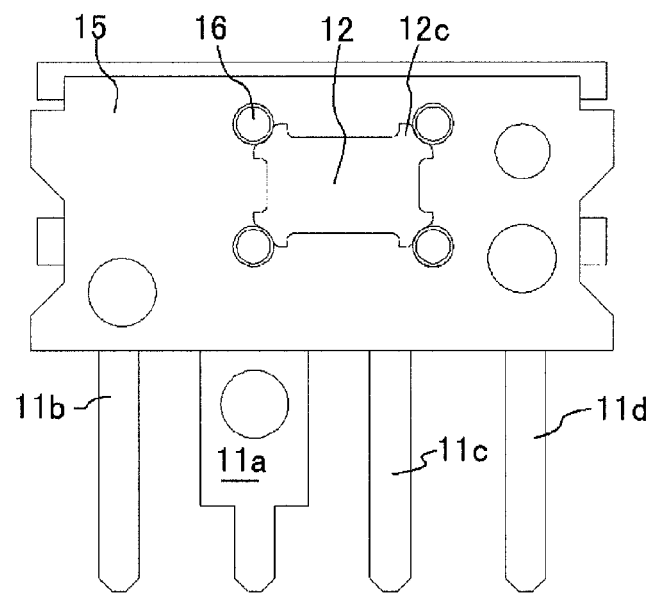

As shown in FIG. 1c, the back side of the second metal member 12 is exposed from the rear face of the resin package 15. As discussed above, the shape in which the second metal member 12 is exposed (in plan view from the rear) originates in the shapes of the thin film peripheral edge 12a, which becomes thinner (smaller height) from the upper face side of the second metal member 12, the cut-outs 12d at the corners, and the extremely thin portions 12e, which become thinner (smaller height) from the lower face side of the second metal member 12, and while the basic shape is substantially rectangular; this shape has at its four corners protruding parts 12c in the form of gingko leaves with rounded cut-outs 12d.

As shown in FIG. 1b, inside the resin package 15, part of the rear face of the first metal member 11a is disposed facing and overlapping the upper face of the thin film peripheral edge 12a of the second metal member 12.

Furthermore, the exposed face of the second metal member 12 in the resin package 15 has recesses 16 that expose part of the side faces of the cut-outs 12d, at positions corresponding to the cut-outs 12d at the four corners of the second metal member 12. These recesses 16 are, for example, circular with a diameter of about 0.6 mm, and have a depth of about 0.5 to 0.8 mm.

The resin package 15 is molded integrally with the metal members by casting a molten resin material through a gate formed in the lower face into a closed metal mold in which the first, second, and other metal members 11a to 11d and 12 have been inserted, and then curing the resin. In this case, to keep the second metal member 12 in the above-mentioned position, holes in which pins are inserted are formed at specific locations in the mold, pins are stuck into these holes, and the pins are butted against the cut-outs 12d formed in the protruding parts 12c of the second metal member 12 to fix the second metal member 12. After the resin material has flowed in and been cured, and the molded member is taken out of the mold, the pins are removed. The recesses 16 for the removal of the pins are formed in the back side of the resin package 15.

Although not depicted in the drawings, protective elements are mounted on any of the metal members in this resin package 15.

Also, the inside of the window 15a of the resin package 15 in which the light emitting elements 13 and 14 are mounted is filled with a translucent covering material composed of an epoxy resin, and the resin is cured.

With a light emitting device constituted in this way, since two kinds of semiconductor light emitting elements that generate different amounts of heat are mounted on two separated metal members, the heat from the light emitting elements that generate more heat does not directly affect the light emitting elements that generate less heat, and color balance can be maintained over an extended period without shifting the emission wavelengths of the two.

Because the second metal member has a thin film peripheral edge, part of the first metal member can overlap this thin film peripheral edge, the second metal member can have enough surface area for adequate heat dissipation while the distance between the first and second metal members can be shortened, and this in turn minimizes the distance between the light emitting elements mounted on these metal members, and prevents a shift in color balance.

Also, a better heat dissipation effect can be achieved because one side of the second metal member is exposed at the back of the resin package.

Furthermore, since there are cut-outs at the corners of the thin film peripheral edge of the second metal member, when the resin package is molded, the shape of the cut-outs can be utilized (that is, pins or the like that fit this shape can be used) to prevent positional shift of the second metal member, allowing the second metal member to be disposed in the proper place.

Because protruding parts having cut-outs are formed so as to face the corners (in plan view as seen from the rear) of the second metal member exposed from the resin package, bonding by soldering or the like is possible over a larger surface area, affording a better junction/connection.

On the back side of the resin package, recesses are formed at locations corresponding to the cut-outs, for the pins that are utilized during the molding of the resin as discussed above, which means that when the exposed second metal member is mounted by soldering or the like on a mounting substrate or the like, enough space will be ensured to allow excess solder or the like to release, affording better mounting/connection.

Because the second metal member preferably has an extremely thin portion that is even thinner than the thin film peripheral edge formed at a part of the thin film peripheral edge other than the corners, adhesion of the second metal member with the resin package in its thickness direction can be enhanced without hindering the effect of preventing positional shift of the second metal member in its thickness direction.

Also, because there are protrusions to the sides of this extremely thin portion, the extremely thin portion makes its way into the resin package, and this affords good adhesion between the second metal member and the resin package in its width direction.

Example 2

Figure 3A:
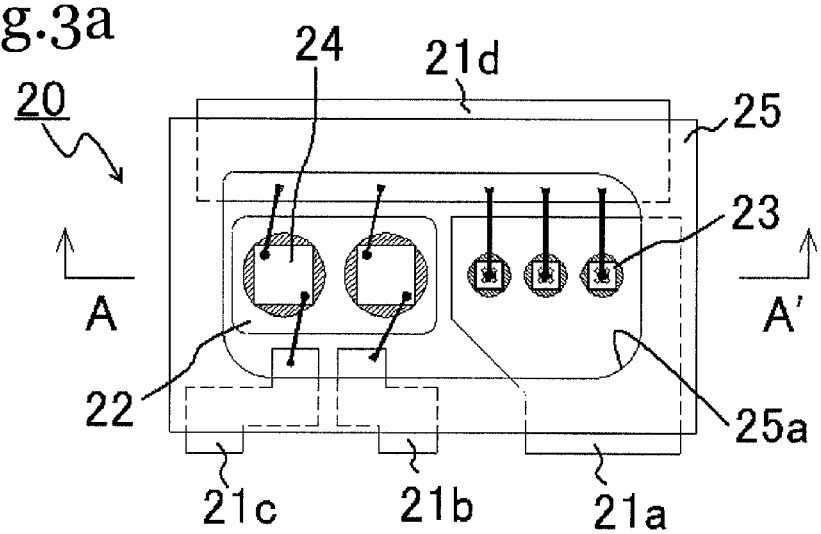
FIGS. 3*a* to 3*c* are simplified views, with 3*a* being a front view, 3*b* a cross-sectional view, 3*c* a rear view of the main components in the another light emitting device of the present invention, respectively.
Figure 3B:
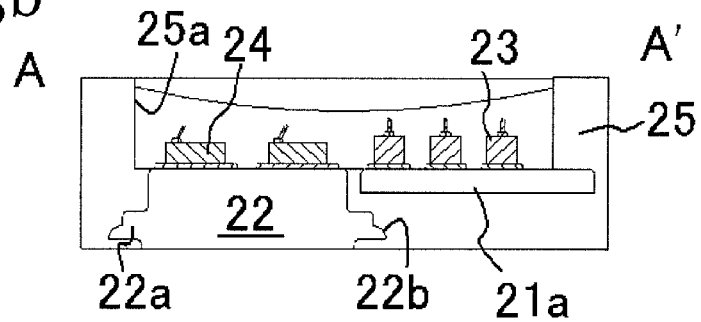
Figure 3C:
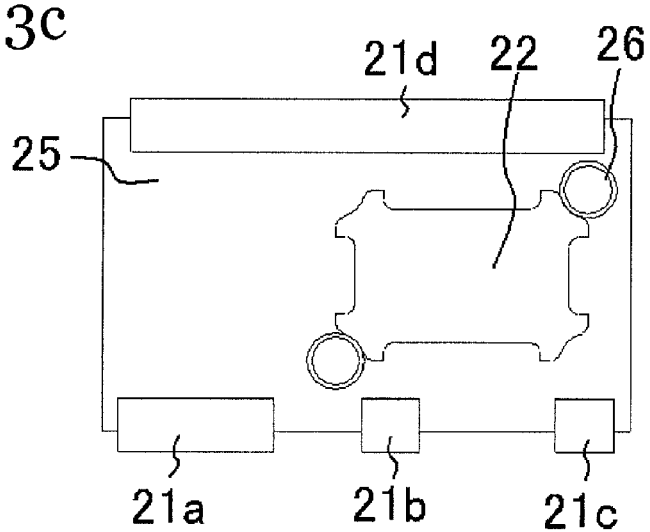

The constitution of this light emitting device 20 is substantially the same as that of the light emitting device in Example 1, except that, as shown in FIGS. 3a to 3c, it is a top view type of surface-mount light emitting device, in which a first metal member 21a, a second metal member 22, and other metal members 21b to 21d that function as terminals are fixed to a resin package 25, and the other ends of these metal members 21a to 21d protrude from the side faces of the resin package 25 and are bent to function as external terminals.

With this light emitting device 20, just two diagonally opposed recesses 26 are disposed corresponding to the cut-outs of the second metal member 22 on the back side of the resin package 25.

This constitution of the light emitting device has substantially the same effect as that of light emitting device of Example 1.

This application claims priority to Japanese Patent Application No. 2006-325095. The entire disclosure of Japanese Patent Application No. 2006-325095 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A light emitting device, comprising:
   a first semiconductor light emitting element;
   a second semiconductor light emitting element;
   a first metal member mounting on a top face the first semiconductor light emitting element;
   a second metal member mounting on a top face the second semiconductor light emitting element; and
   a resin package having on a top face a window through which light is taken out from the first semiconductor light emitting element and the second semiconductor light emitting element,
   wherein the second metal member is thinner around a thin film peripheral edge than in a middle portion,
   a rear face of the first metal member is facing a top face of the thin film peripheral edge, and
   the thin film peripheral edge being spaced apart from a rear face of the resin package toward the top face of the resin package such that the thin film peripheral edge is embedded within the resin package.

2. The device according to claim 1, wherein the first semiconductor light emitting element and the second semiconductor light emitting element emit light of different wavelengths.

3. The device according to claim 1, wherein a rear face of the second metal member is exposed from the rear face of the resin package.

4. The device according to claim 1, wherein the thin film peripheral edge of the second metal member has cut-outs at corners, and the resin package has a recess on a rear face at a location corresponding to the cut-out of at least one corner.

5. The device according to claim 1, wherein an extremely thin portion that is even thinner than the thin film peripheral edge is formed at a part of the thin film peripheral edge other than corners, and the extremely thin portion has a protrusion that protrude to side.

6. The device according to claim 3, wherein the second metal member exposed from the resin package has protrusions having cut-outs at corners in a plan view from the rear face.

7. The device according to claim 1, wherein a top face of the first metal member and a top face of the second metal member are both disposed within the window formed in the resin package in a plan view from the top face.

8. The device according to claim 1, wherein at least a rear face of the package and a rear face of the second metal member form a rear face of the light emitting device.

9. The device according to claim 1, wherein a rear face of the package is substantially flash with a rear face of the second metal member on a rear face of the light emitting device.

* * * * *